United States Patent
Bailey (10) Patent No.: US 7,817,418 B2
(45) Date of Patent: Oct. 19, 2010

(54) ELECTRONIC DEVICE INCLUDING A SUPPORT MEMBER AND A METHOD OF FABRICATING THE SAME

(75) Inventor: Kevin M. Bailey, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 22 days.

(21) Appl. No.: 12/248,328

(22) Filed: Oct. 9, 2008

(65) Prior Publication Data

US 2010/0091441 A1 Apr. 15, 2010

(51) Int. Cl.
G06F 1/16 (2006.01)
(52) U.S. Cl. .................................................. 361/679.59
(58) Field of Classification Search ............ 361/679.59, 361/679.55
See application file for complete search history.

(56) References Cited

U.S. PATENT DOCUMENTS

| | | | |
|---|---|---|---|
| 3,562,847 A | | 2/1971 | Jemison |
| 4,718,631 A | | 1/1988 | Reynolds et al. |
| 4,937,563 A | * | 6/1990 | Shekita et al. ............... 248/678 |
| 5,469,327 A | * | 11/1995 | Cheng .................. 361/679.55 |
| 5,818,688 A | * | 10/1998 | Gluskoter et al. ...... 361/679.09 |
| 5,818,690 A | * | 10/1998 | Spencer ................. 361/679.09 |
| 5,918,957 A | * | 7/1999 | Bovio et al. .............. 312/223.2 |
| 6,024,338 A | | 2/2000 | Koike et al. |
| 6,053,589 A | * | 4/2000 | Lin .............................. 312/271 |
| 6,097,592 A | * | 8/2000 | Seo et al. ............... 361/679.55 |
| 6,097,595 A | * | 8/2000 | Cipolla .................. 361/679.21 |
| 6,357,717 B1 | | 3/2002 | Kennard, IV |
| 6,498,719 B1 | * | 12/2002 | Bridges ................. 361/679.34 |
| 6,654,237 B1 | * | 11/2003 | Lee ......................... 361/679.55 |
| 6,842,337 B2 | * | 1/2005 | Helot et al. ............. 361/679.59 |
| 7,079,383 B2 | * | 7/2006 | Homer ................... 361/679.35 |
| 7,095,610 B1 | * | 8/2006 | Banko .................... 361/679.55 |
| 7,328,880 B2 | * | 2/2008 | Helot et al. ............. 248/346.01 |
| 7,433,176 B2 | * | 10/2008 | Kyle et al. .............. 361/679.01 |
| 7,450,373 B2 | * | 11/2008 | Lee et al. ................ 361/679.55 |
| 2006/0285285 A1 | * | 12/2006 | Tracy et al. .................. 361/683 |

(Continued)

OTHER PUBLICATIONS

Richco, Inc. "Motion Control, Bumpers and Feet". Aug. 1, 2008. pp. 1-2. <http://www.richco-inc.com/browseframes.asp>.

(Continued)

Primary Examiner—Lisa Lea-Edmonds
(74) Attorney, Agent, or Firm—Larson Newman & Abel, LLP (57) ABSTRACT

An electronic device can include a housing and support members. In an embodiment, the housing includes an opening extending through an exterior wall. The opening can include a wider portion that is spaced apart from the opposite ends of the opening. The housing can include a recessed region that lies along a perimeter of the opening. A support member lies within the opening, and a portion of the support member lies within the recessed region. The shapes of the opening and the support member can be such that the support member can be inserted relatively easily into the opening, yet still resist accidental removal of the support members during normal use and handling of the electronic device. In a particular embodiment, the support member can be a single piece of elastomeric material and help to provide acoustical isolation.

12 Claims, 5 Drawing Sheets

U.S. PATENT DOCUMENTS

2007/0103859 A1* 5/2007 Yu .............................. 361/683
2008/0074831 A1 3/2008 Lee et al.
2008/0253081 A1* 10/2008 Tracy et al. ................. 361/687
2009/0268396 A1* 10/2009 Tang ..................... 361/679.55
2009/0268397 A1* 10/2009 Tang ..................... 361/679.55
2009/0268398 A1* 10/2009 Tang ..................... 361/679.55

OTHER PUBLICATIONS

"Provide extra small rubber feet for your laptops". Dell, Inc. Jul. 11, 2007. pp. 1-4 Messages posted to http://www.ideastorm.com/article/show/71574/Provide_extra_small_rubber_feet_for_your_laptops .
"Smaller rubber feet that don't fall off". Dell, Inc. Jul. 2, 2007. pp. 1-6 Messages posted to http://www.dellideastorm.com/article/show/70965/Smaller_rubber_feet_that_dont_fall_off.

* cited by examiner

ELECTRONIC DEVICE INCLUDING A SUPPORT MEMBER AND A METHOD OF FABRICATING THE SAME

FIELD OF THE DISCLOSURE

This disclosure relates generally to electronic devices and methods, and more particularly to electronic devices having support members and methods of making the same.

DESCRIPTION OF THE RELATED ART

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

BRIEF DESCRIPTION OF THE DRAWINGS

Skilled artisans appreciate that elements in the figures are illustrated for simplicity and clarity and have not necessarily been drawn to scale. For example, the dimensions of some of the elements in the figures may be exaggerated or minimized relative to other elements to help to improve understanding of embodiments of the invention. Embodiments incorporating teachings of the present disclosure are illustrated and described with respect to the drawings presented herein.

The use of the same reference symbols in different figures indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

An electronic device can include a housing and support members. In an embodiment, the housing includes an opening extending through an exterior wall. The opening can includes a wider portion that is spaced apart from the opposite ends of the opening. The housing can also include a recessed region that lies along a perimeter of the opening. A support member lies within the opening, and a portion of the support member lies within the recessed region. The shapes of the opening and the support member can be such that the support member can be inserted relatively easily into the opening, yet still resist accidental removal of the support members during normal use and handling of the electronic device. In a particular embodiment, the support member can be a single piece of elastomeric material and can help to provide acoustical isolation, such that less vibration or other acoustical energy is transmitted from the electronic device to a desk, tabletop, or another surface upon which the electronic device rests. The support members do not require an adhesive compound, secondary hardware, or a complex attachment method to remain in place.

In this specification, a general description of an electronic device will be given, followed by exemplary location and orientation of support members along one or more exterior surfaces of a housing for an electronic device. Particular details of the openings and support members will be described followed by alternative embodiments to allow skilled artisans to better appreciate of the scope of the concepts described herein. Many embodiments, including those not described, are possible without deviating from the concepts described herein, and therefore, this specification should be construed as been illustrative and not limiting of the present invention.

An electronic device can include components that are interconnected within a housing to perform a desired function. In one embodiment, the electronic device can be an information handling system. An exemplary information handling system include a desktop computer, a laptop computer, a server computer, a personal digital assistant, a mobile phone, or the like. In a particular embodiment, the electronic device can include a component with a moving part, such as a fan, a hard drive, or another similar component. Such components may cause vibration or otherwise generate acoustical energy when the component is in a normal operating mode. In an alternative embodiment, the electronic device does not require any moving parts.

Figure 1:
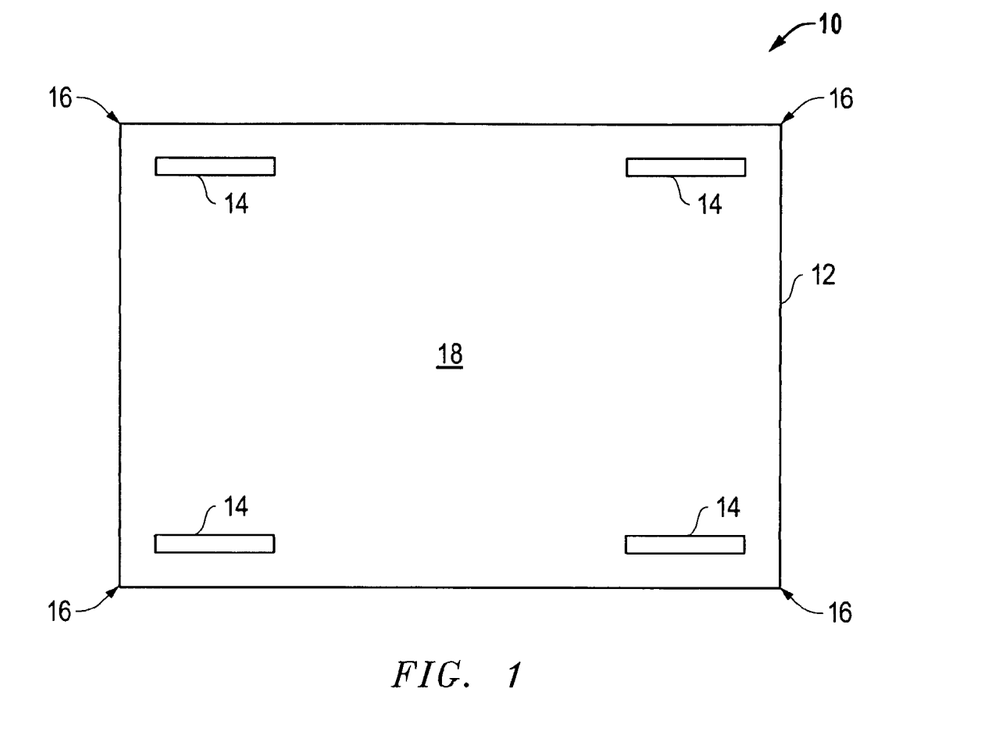
FIG. 1 includes an illustration of support members mounted along an exterior surface of a housing for an electronic device.

FIG. 1 includes an illustration of an exterior surface of a housing 12 for an electronic device 10, such as any of the electronic devices previously described. In a particular embodiment, the electronic device 10 is an information handling system including components with moving parts, such as a fan, a hard drive, or another similar component. The electronic device 10 also includes support members 14 that are located along an exterior surface and near the corners 16 of the housing 12. The support members 14 may also be referred to as feet. In an embodiment, lengths of the support members 14 may lie along one or more substantially parallel directions. Such an orientation may allow for a quicker and more economical fabrication process when the support members 14 are attached to the housing 12. In a different embodiment, the support members 14 may be oriented differently. For example, one or more of the support members 14 may be oriented such that a length of a support member 14 is in a direction substantially perpendicular to that illustrated in FIG. 1. In still another embodiment, more support members may be used but are not illustrated. For example, other support members may lie between the support members 14 at locations that are substantially equidistant from their closest pair of corners 16. In still another embodiment, a support member may lie near the center of the exterior surface 18. After reading this specification, skilled artisans will appreciate that many different options are available regarding the number and orientation of support members with respect to the exterior surface 18 of the housing 12. The support members 40 may be the same or different from one another.

Figure 2:
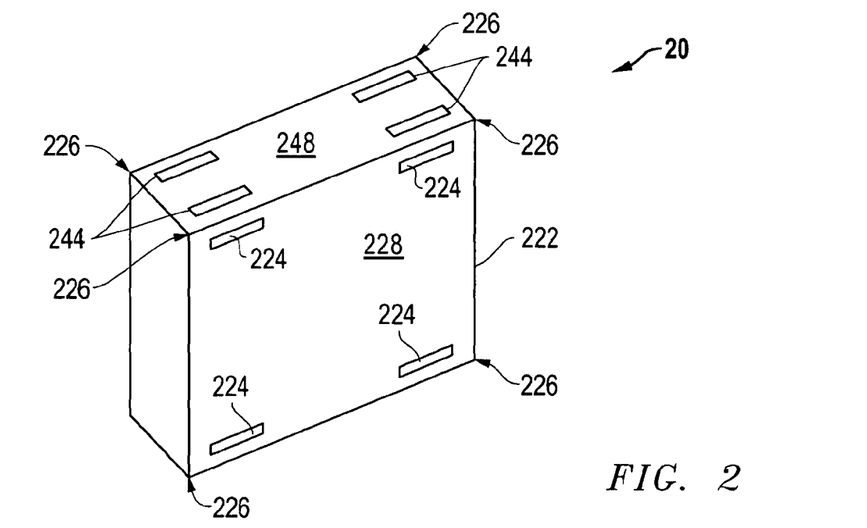
FIG. 2 includes an illustration of a perspective view of support members mounted along different exterior surfaces of a housing for an electronic device.

FIG. 2 includes an illustration of a perspective view of an electronic device 20. The electronic device 20 may be any of the types previously described and may be the same as or different from the electronic device 10. The electronic device 20 includes a housing 222 having two exterior surfaces 228 and 248, wherein the exterior services 228 and 248 are substantially perpendicular to each other. In this embodiment, support members 224 lie along the exterior surface 228, and the support members 244 lie along the exterior surface 248. In the embodiment as illustrated in FIG. 2, the support members 224 and 244 lie near corners 226 of the housing 222. Similar to electronic device 10, skilled artisans will appreciate that many different configurations for the support members with respect to the exterior surfaces 228 and 248 may be used. The support members 224 and 244 may be the same or different as compared to one another. The embodiment as illustrated in FIG. 2 can be useful when the housing may rest on the support members 224 along the exterior surface 228, and at another time, rest on the support members 244 along the exterior surface 248.

Figure 3:
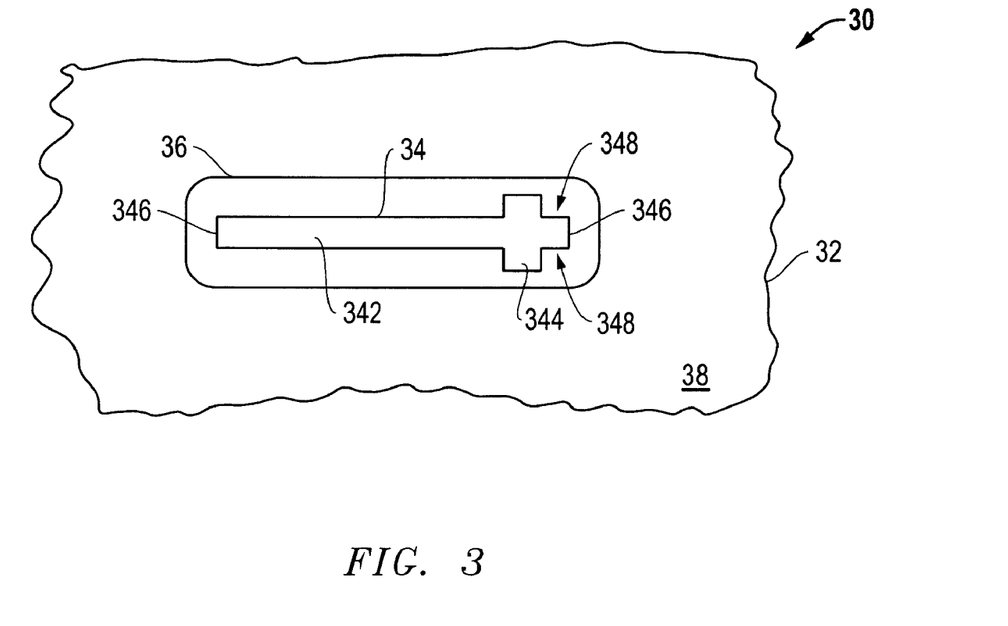
FIG. 3 includes an illustration of an opening extending through an exterior wall of the housing, and a recessed region around the perimeter of the opening.

FIG. 3 illustrates a portion of an electronic device 30 including a housing 32 having an exterior surface 38. The electronic device 30 may be any of the electronic devices previously described, such as electronic devices 10 or 20. The exterior surface 38 includes an opening 34 extending through an entire thickness of the wall of the housing 32. The opening 34 can include narrower portions 342 adjacent to the ends 346 of the opening 34, and a wider portion 344 spaced apart from both of the ends 346. In this particular embodiment, the wider portion 344 is closer to one of the ends 346, as compared to the other. This configuration allows locking tabs 348 to be formed and help to retain a support member when it is placed into the opening. A recessed region 36 lies around the perimeter of the opening 34. The recessed region 36 should be large enough such that the support member (not illustrated in FIG. 3) lies within the recessed region. In a particular embodiment, the thickness of the wall within the recessed region 36 can be substantially the same as the thickness of the wall of the housing 32 outside of the recessed region 36. The opening 34 and the recessed region 36 can be formed during a stamping operation, in another embodiment may be formed using a different technique, and in still another embodiment, the opening 34 may be formed at a different time from forming the recessed region 36.

Figure 4:
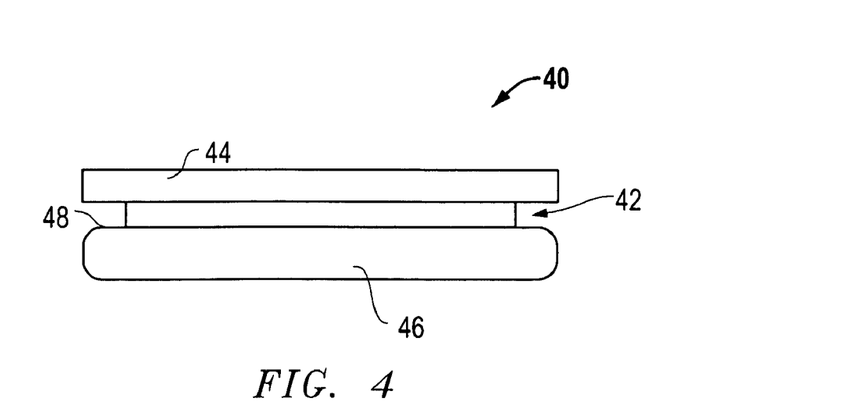
FIG. 4 includes a side view of a support member.

FIG. 4 includes an illustration of a side view of a support member 40. The support member 40 includes a groove 42 lying along substantially all of the perimeter of the support member 40. A portion of the wall of the housing 32 will lie within the groove 42 when the support member 40 is attached to the housing 32. The support member 40 also includes an interior portion 44 that will be positioned within the interior of the housing 32 of the electronic device 30 when the support member 40 is attached to the housing 32. A support portion 46 lies on the opposite side of the groove 42 and will be exposed along the outside of the housing 32. A thickness of the support portion 46 is greater than the depth of the recessed region 36, so that the housing 32 does not contact a desk, tabletop, or another working surface. The support portion 46 also includes a load-bearing surface 48, the significance of which will be described later in this specification.

The support member 40 can include a single piece of an elastomeric material. The elastomeric material helps to reduce the transfer of acoustical energy from the electronic device 30 to a desk, tabletop, or another working surface. Thus, the support member 40 may be compressible enough so that it does a sufficient job of reducing the transfer of acoustical energy but may not be so compressible that the electronic device 30 touches the a desk, tabletop, or another working surface. In a particular embodiment, the elastomeric material has a Shore A hardness of at least 40, and in another particular embodiment, the elastomeric material has a Shore A hardness of no greater than 50. Exemplary, non-limiting materials include rubber, silicone, polymers, copolymers, modified polymers, or any combination thereof. In a particular embodiment, the elastomeric material includes silicone rubber. The support member 40 can be formed by an injection molding, compression molding, or another conventional or proprietary technique. After reading this specification, skilled artisans will appreciate that many other compounds can be used as an elastomeric material, and the other fabrication processes for forming the support member 40 may be used.

Figure 5:
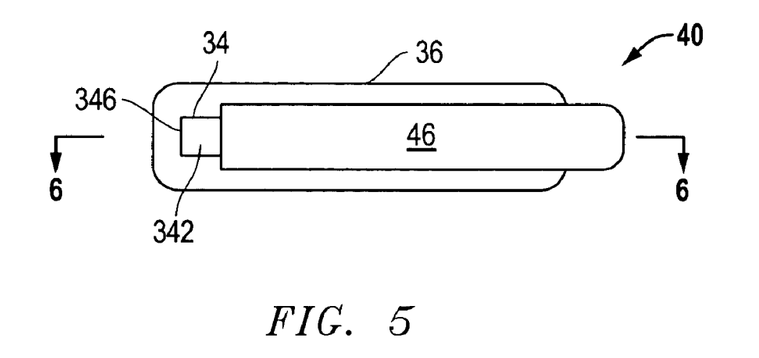
FIGS. 5 to 8 include views illustrating a portion of a fabrication method when the support member of FIG. 4 is inserted into the opening of FIG. 3.
Figure 6:
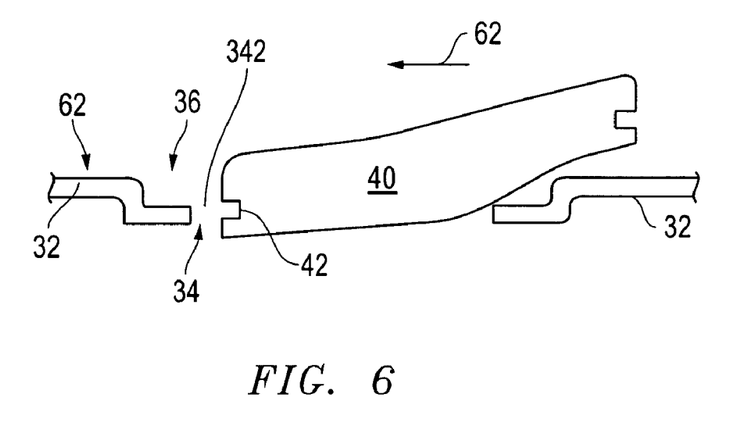

FIGS. 5 to 8 include illustrations during an insertion process when the support member 40 is inserted within the opening 34 of the housing 32. FIG. 5 and 6 include an illustration of views of a portion of the exterior surface 38 of the housing 32 when the support member 40 is partially inserted within the opening 34. FIG. 6 includes a cross-sectional view along sectioning line 6-6 in FIG. 5. The support member 40 is initially inserted into the wider portion 344 of the opening 34. A combination of the groove 42 of the support member 40 and the portion of the housing 32 within the recessed region 36 help to guide the support member 40 as it is inserted. The motion of the support member 40 is generally parallel to the exterior surface of the housing 32, and is illustrated by arrow 62 in FIG. 6.

Figure 7:
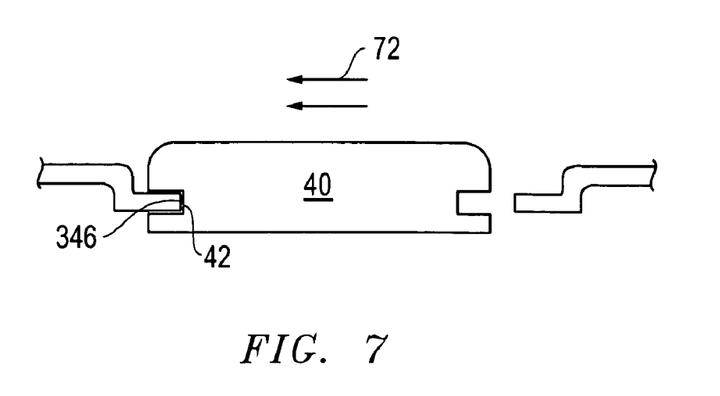
Figure 8:
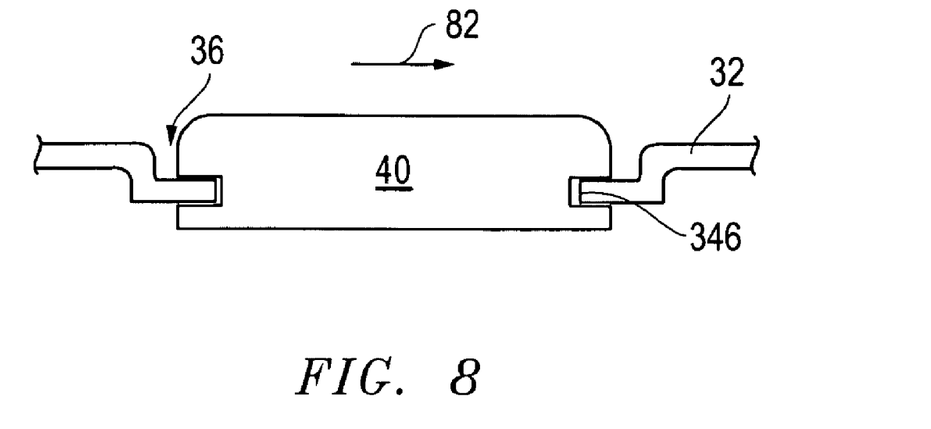

Referring to FIG. 7, after the support member 40 has been inserted into the opening such that the groove 42 of the support member 40 lies at an end 346 of the opening 34, the support member 40 is compressed such that all or nearly all of the groove 42 lies within the opening 34. This action is generally illustrated in FIG. 7 as double arrow is 72 to illustrated that more force may be used at this point to compress the support member 40, whereas the insertion as illustrated in FIGS. 5 and 6 can be performed with little resistance. After compression, the support member 40 is released so that the locking tabs 348 (see FIG. 3) lie within the groove 42. This releasing action causes the support member 40 to move in a direction substantially parallel to the surface of the housing 32 as illustrated by arrow 82. However, the direction of movement during release is substantially opposite to the direction of movement during insertion. At this time, the support member 40 securely lies within the opening 34 and the recessed region 36 of the housing 32.

Figure 9:
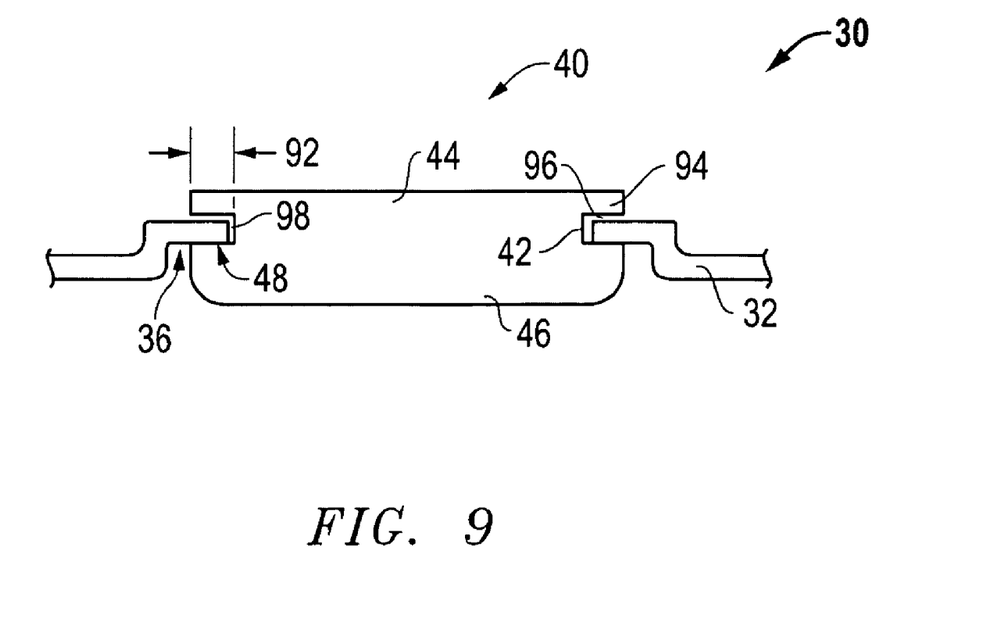
FIG. 9 includes an illustration of a cross-sectional view of the electronic device after the support member has been inserted into the opening.

After all of the support members 40 are inserted and locked in place, the electronic device 30 can be positioned so that it is resting on its support members, such as the support member 40, as illustrated in FIG. 9. The view in FIG. 9 is substantially perpendicular to the views in FIGS. 6 to 8. The support member 40 can be generally I-shaped, and in a particular embodiment, has a shape similar to an I-beam. The support portion 46 lies within the recessed region 36 and extends beyond the surface of the housing 32 outside of the recessed region 36, such that the housing 32 does not contact a desk, tabletop, or another working surface. The support members 40 support the weight of the electronic device 30 along the load-bearing surface 48 of the support member 40. Because the load-bearing surface 48 lie within the recessed region 36, an object sliding or otherwise moving along the exterior surface of the wall 32 outside of the recessed region 36 is less likely to pry the support member 40 out of the opening 34.

The interior portion 44 has protrusions 94 that extend over the groove 42 by a dimension 92. The dimension 92 has no theoretical upper limit; however, from a practical aspect, if the dimension 92 is too large, the support member 40 may contact or interfere with other parts of the electronic device 30. On the other end of the spectrum, the dimension 92 should be sufficiently large, so that the support member 40 is not easily removed from the opening. In non-limiting embodiments, the dimension 92 is at least 1% of the width of the support member 40, at least 5% of the width of the support member 40, or at least 11% of the width of the support member 40. In other non-limiting embodiments, the dimension 92 is no more than 40% of the width of the support member 40, no more than 35% of the width of the support member 40, or no more than 30% of the width of the support member 40. In a particular embodiment, the dimension 92 is in a range of approximately 20% to 30% of width of the support member 40. After reading this specification, skilled artisans can determine the dimension 92 that meets their needs or desires for their particular application.

As further illustrated in FIG. 9, a gap 96 lies between a surface of the protrusion 94 and the wall 32, and a gap 98 lies between an innermost surface along the groove 42 and the wall 32. The gaps 96 and 98 help to allow support member 40 to be more readily inserted as the wall 32 passes along the groove 42 of the support member.

Figure 10:
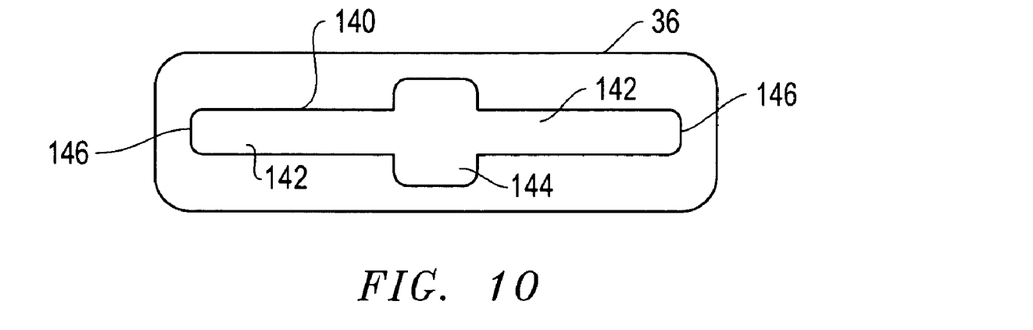
FIG. 10 includes an illustration of an opening extending through an exterior wall of the housing in accordance with another embodiment.

Other embodiments can be used without departing from the concepts as described herein. FIG. 10 includes an illustration of an opening 140 that lies within the recessed region 36. The opening 140 includes a wider portion 144 between narrower portions 142. In this particular embodiment, the wider portion 144 can be substantially equidistant from the ends 146 of the opening 140, and a support member, such as the support member 40 in FIG. 4, can be used. In one embodiment, the support member may be inserted into the opening 140, using the wider portion 144 of the opening to guiding the support member to one of the ends 146 of the opening 14, and then sliding the other end of the support member into the opening 140 such that it slides to the other end 146 of the opening 140. In still another embodiment, both ends of the support member may be inserted into the opening 140 at the wider portion 144, and at substantially the same time and allow the support member to spline into position. Skilled artisans appreciate that other opening configurations can be used without departing from the scope of the concepts as described herein.

Figure 11:
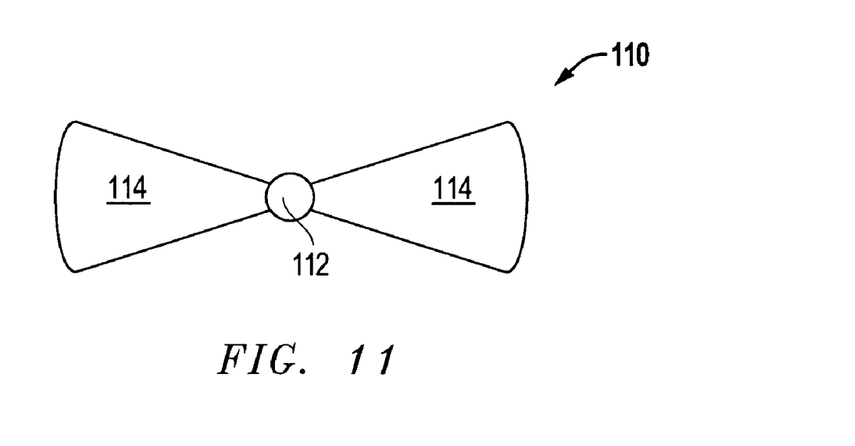
FIG. 11 includes an illustration of a support member that includes a hub and projections extending from the hub.
Figure 12:
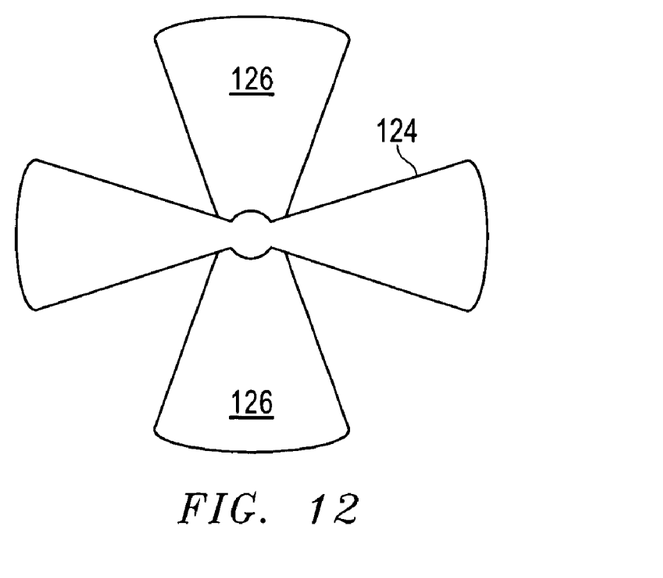
FIG. 12 includes an illustration of an opening extending through the exterior wall of a housing for an electronic device.

FIGS. 11 and 12 include illustrations of another embodiment in which a support member may be inserted in rotated into position. In this particular embodiment, the support member 110 can include an insertion feature having a hub 112 and projections 114 extending from the hub 112. The projections 114 may or may not be of equal size is compared to each other. Although not illustrated, a groove extends from the outer edges of projections 94 to near the hub 112. Referring to FIG. 12, an opening 124 in the housing has a corresponding shape that generally matches the shape of the insertion feature of the support member 110. Recessed regions 126 lie at different angular positions, as compared to the opening 124. After the support member 110 is inserted into the opening 120, the support member 110 can be rotated such that the projections 114 reside within the recessed regions 126 of the wall of the housing. The recessed region is 126 may allow the support member 110 to be retained within its position, thus effectively locking the support member 110 in place.

Other embodiments, not illustrated, can be used for particular applications. The embodiments described herein are for illustration purposes and do not limit the scope of the present invention.

Embodiments, such as embodiments described herein, have benefits over other structures and methods used for support members. An adhesive compound is not required, and therefore, separation of the support members due to failure of the adhesive compound is not an issue. Therefore, users will have a lower likelihood of the support members separating from the electronic device as the electronic device is loaded or unloaded from carrying cases, backpacks, or other containers. Also, movement of the electronic device along a tabletop will be less likely to cause the support members to become pried-off or otherwise detached from the surface.

Secondary hardware is not required, and therefore, items such as brackets, screws or other hardware are not needed. Therefore, the complexity and price with using secondary hardware can be substantially eliminated. In addition, the single piece of elastomeric material is relatively inexpensive and can provide good acoustic isolation between the electronic device and corresponding desk, tabletop, or other surface on which the electronic device rests.

The support members as described herein are a better alternative to other single piece support members, such as conventional support members that include barbs or are threaded. Conventional support members can include barbs, which from a cross-sectional view have a Christmas-tree profile. Unlike the support members described herein, the conventional support members with barbs are inserted by applying a force substantially perpendicular to the exterior wall of the housing. The force needed may be substantial, and a fabrication operator may not be certain that the barbs have been fully deployed after insertion. The support members as described herein are significantly easier to insert, and a fabrication operator will have a greater level of confidence that the support member is properly installed.

Conventional single piece, threaded support members are typically made from relatively harder plastic materials that may perform poorly with respect to reducing vibration or other acoustical energy. Also, the conventional threaded support member may limit configuration options.

The support members as described herein provide a relatively inexpensive solution to many of the problems seen with conventional support members. The support members as described herein do not require an adhesive compound, are relatively inexpensive and can be formed with existing materials and techniques, are relatively easy to install with a better expectation of success, provide good acoustical isolations, and allow a designer more options on the configuration and appearance of the support members.

Many different aspects and embodiments are possible. Some of those aspects and embodiments are described below.

After reading this specification, skilled artisans will appreciate that those aspects and embodiments are only illustrative and do not limit the scope of the present invention.

In a first aspect, an electronic device can include a housing. The housing can include an exterior wall and a first opening extending through the exterior wall, wherein the first opening is configured to receive a support member. The first opening can include a first end and a second end opposite the first end along a length of the first opening. The first opening can also include a first portion and a second portion, wherein the first portion is adjacent to the first end, and the second portion that is spaced apart from the first and second ends, wherein the second portion is wider than the first portion.

In an embodiment of the first aspect, the electronic device further includes a first support member lying within opening. In a particular embodiment, the first support member includes a single piece of an elastomeric material. In another particular embodiment, the housing includes a recessed region lying around a perimeter of the first opening, and the first support member lies within the recessed region. In a more particular embodiment, the housing has an external surface outside the recessed region and adjacent to the first opening, wherein the external surface lies along a first plane, and the first support member includes a load-bearing surface that lies along a second plane substantially parallel to and different from the first plane.

In still another particular embodiment, from a cross-sectional view, the first support member is generally I-shaped. In a further particular embodiment, the electronic device further includes a second support member substantially identical to the first support member. The housing has a first surface and a second surface substantially perpendicular to the first surface, and a second opening extending through the exterior wall of the housing, wherein the second opening is substantially identical to the first opening. The first opening and the first support member lie along the first surface, and the second opening and the second support member lie along the second surface.

In another embodiment of the first aspect, the housing includes a recessed region lying around a perimeter of the first opening. The first support member lies within the recessed region and the first opening, includes a single piece of an elastomeric material, and includes a groove lying along substantially all of a perimeter of the support member, wherein a portion of the exterior wall lies within the groove. The first support member has a length and a width, as measured in directions substantially parallel to an external surface of the housing, wherein the length is substantially larger than the width.

In a more particular embodiment of the first aspect, the electronic device further includes a second support member, a third support member, and a fourth support member, each of which is substantially identical to the first support member. The housing includes a second opening, a third opening, and a fourth opening, each of which extends through the exterior wall and is substantially identical to the first opening, wherein the first, second, third, and fourth openings lie near different corners along a same surface of the exterior wall. The housing further includes a first recessed region, a second recessed region, a third recessed region, and a fourth recessed region, each of which is substantially identical to one another, and wherein the first recessed region lies around a perimeter of the first opening, the second recessed region lies around a perimeter of the second opening, the third recessed region lies around a perimeter of the third opening; and the fourth recessed region lies around a perimeter of the fourth opening. The first support member lies within the first recessed region and the first opening, the second support member lies within the second recessed region and the second opening, the third support member lies within the third recessed region and the third opening, and the fourth support member lies within the fourth recessed region and the fourth opening.

In a further embodiment of the first aspect, the electronic device includes an information handing system. In a particular embodiment, the information handling system includes a desktop computer or a server computer. In another particular embodiment, the information handling system includes a laptop computer.

In a second aspect, a method of fabricating an electronic device can include providing a housing of the electronic device, wherein the housing includes an exterior wall lying along a plane, and the housing further includes an opening extending through the exterior wall of the housing. The method can also include inserting a support member in a first direction substantially parallel to the plane, and locking the support member in place by moving the support member in a second direction substantially parallel to the plane, wherein the second direction is substantially opposite to the first direction.

In an embodiment of the second aspect, the opening includes a first portion and a second portion, wherein the first portion lies adjacent to a first end, and the second portion lies adjacent to a second end that is opposite the first end along a length of the opening. The opening includes a third portion that is spaced apart from the first and second ends, wherein the third portion is wider than each of the first and second portions. In another embodiment, the housing further includes a recessed region along the exterior wall around a perimeter of the opening. In yet another embodiment, the method further includes compressing the support member after inserting the support member and before locking the support member in place.

In a third aspect, an electronic device can include a support member including a single piece of elastomeric material, wherein the support member has an insertion feature. The insertion feature can include a hub and spaced-apart projections extending from the hub, and the spaced-apart projections only partially surround the hub. The electronic device can also include a housing including an exterior wall having opening extending the exterior wall, wherein a shape of the opening corresponds to a shape of the insertion feature, and the spaced-apart projections are rotationally offset from the opening.

In an embodiment of the third aspect, the insertion feature and the opening each have a generally bow-tie shape. In another embodiment, the housing includes a recessed region, wherein the recessed region lies at a different angular position, as compared to the opening. In yet another embodiment, the electronic device includes an information handling system.

After reading this specification, the functionality or performance of the methods described herein can be implemented in hardware, firmware, software, other machine-readable code, or any combination thereof. Further, methods described herein can be performed automatically; however, a portion of the method can be performed manually if needed or desired.

Note that not all of the activities described above in the general description or the examples are required, that a portion of a specific activity may not be required, and that one or more further activities may be performed in addition to those described. Still further, the order in which activities are listed are not necessarily the order in which they are performed.

In the description herein, a flow charted technique is described in a series of sequential actions. The sequence of the actions and the party performing the steps may be freely changed without departing from the scope of the teachings. Actions may be added, deleted, or altered in several ways. Similarly, the actions may be re-ordered or looped. Further, although processes, methods, algorithms or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described herein. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising a housing, wherein:
   the housing includes a first opening extending through an exterior wall;
   the first opening is configured to receive a support member;
   the first opening includes a first end and a second end opposite the first end along a length of the first opening; and
   the first opening includes a first portion and a second portion, wherein the first portion is adjacent to the first end, and the second portion that is spaced apart from the first and second ends, wherein the second portion is wider than the first portion.

2. The electronic device of claim 1, further comprising a first support member lying within opening.

3. The electronic device of claim 2, wherein the first support member comprises a single piece of an elastomeric material.

4. The electronic device of claim 2, wherein from a cross-sectional view, the first support member is generally I-shaped.

5. The electronic device of claim 2, further comprising a second support member substantially identical to the first support member, wherein:
   the housing has a first surface and a second surface substantially perpendicular to the first surface;
   a second opening extending through the exterior wall of the housing, wherein the second opening is substantially identical to the first opening;
   the first opening and the first support member lie along the first surface; and
   the second opening and the second support member lie along the second surface.

6. The electronic device of claim 1, wherein the electronic device comprises an information handing system.

7. The electronic device of claim 6, wherein the information handling system includes a desktop computer or a server computer.

8. The electronic device of claim 6, wherein the information handling system includes a laptop computer.

9. An electronic device comprising a housing, wherein:
   the housing includes a first opening extending through an exterior wall;
   the first opening is configured to receive a support member;
   the first opening includes a first end and a second end opposite the first end along a length of the first opening;
   the first opening includes a first portion and a second portion, wherein the first portion is adjacent to the first end, and the second portion that is spaced apart from the first and second ends, wherein the second portion is wider than the first portion;

the housing includes a recessed region lying around a perimeter of the first opening; and the first support member lies within the recessed region.

10. The electronic device of claim 9, wherein: the housing has an external surface outside the recessed region and adjacent to the first opening, wherein the external surface lies along a first plane; and the first support member includes a load-bearing surface that lies along a second plane substantially parallel to and different from the first plane.

11. An electronic device comprising a housing, wherein:

the housing includes a first opening extending through an exterior wall;

the first opening is configured to receive a support member;

the first opening includes a first end and a second end opposite the first end along a length of the first opening;

the first opening includes a first portion and a second portion, wherein the first portion is adjacent to the first end, and the second portion that is spaced apart from the first and second ends, wherein the second portion is wider than the first portion;

the housing includes a recessed region lying around a perimeter of the first opening;

the first support member lies within the recessed region and the first opening;

the first support member comprises a single piece of an elastomeric material;

the first support member includes a groove lying along substantially all of a perimeter of the support member;

a portion of the exterior wall lies within the groove; and the first support member has a length and a width, as measured in directions substantially parallel to an external surface of the housing, wherein the length is substantially larger than the width.

12. The electronic device of claim 11, further comprising a second support member, a third support member, and a fourth support member, each of which is substantially identical to the first support member, wherein: the housing includes a second opening, a third opening, and a fourth opening, each of which extends through the exterior wall and is substantially identical to the first opening, wherein the first, second, third, and fourth openings lie near different corners along a same surface of the exterior wall; the housing further includes a first recessed region, a second recessed region, a third recessed region, and a fourth recessed region, each of which is substantially identical to one another, and wherein the first recessed region lies around a perimeter of the first opening, the second recessed region lies around a perimeter of the second opening, the third recessed region lies around a perimeter of the third opening; and the fourth recessed region lies around a perimeter of the fourth opening; the first support member lies within the first recessed region and the first opening; the second support member lies within the second recessed region and the second opening; the third support member lies within the third recessed region and the third opening; and the fourth support member lies within the fourth recessed region and the fourth opening.

* * * * *